United States Patent
Shinagawa et al.

(10) Patent No.: US 6,914,925 B2
(45) Date of Patent: Jul. 5, 2005

(54) VERTICAL CAVITY SURFACE EMITTING SEMICONDUCTOR LASER DEVICE

(75) Inventors: Tatsuyuki Shinagawa, Tokyo (JP); Norihiro Iwai, Tokyo (JP); Noriyuki Yokouchi, Tokyo (JP)

(73) Assignee: The Furukawa Electric Co., Ltd., Tokyo (JP)

(*) Notice: Subject to any disclaimer, the term of this patent is extended or adjusted under 35 U.S.C. 154(b) by 347 days.

(21) Appl. No.: 10/217,227

(22) Filed: Aug. 9, 2002

(65) Prior Publication Data

US 2003/0048824 A1 Mar. 13, 2003

(30) Foreign Application Priority Data

Aug. 10, 2001 (JP) ........................... 2001-244297
Aug. 9, 2002 (JP) ........................... 2002-233222

(51) Int. Cl.[7] .............................................. H01S 5/00
(52) U.S. Cl. ........................... 372/50; 372/45; 372/46; 372/96; 372/99
(58) Field of Search ........................... 372/99, 43–50, 372/96

(56) References Cited

U.S. PATENT DOCUMENTS

| | | | | |
|---|---|---|---|---|
| 5,170,407 A | * | 12/1992 | Schubert et al. | 372/96 |
| 5,397,739 A | * | 3/1995 | Chalmers et al. | 438/7 |
| 5,530,715 A | * | 6/1996 | Shieh et al. | 372/96 |
| 6,014,400 A | * | 1/2000 | Kobayashi | 372/96 |
| 6,201,825 B1 | * | 3/2001 | Sakurai et al. | 372/96 |

* cited by examiner

Primary Examiner—Minsun Oh Harvey
Assistant Examiner—James Menefee
(74) Attorney, Agent, or Firm—Oblon, Spivak, McClelland, Maier & Neustadt, P.C.

(57) ABSTRACT

A vertical cavity surface emitting semiconductor laser (VCSEL) device has p-type and n-type DBRs sandwiching therebetween a resonant cavity including an active layer. Each the DBRs has a plurality of layer pairs each including a $Al_{x1}Ga_{1-x1}As$ high-reflectivity layer and an $Al_{x2}Ga_{1-x2}As$ low-reflectivity layer and an $Al_{x3}Ga_{1-x3}As$ slope content layer interposed between each of the high-reflectivity layers and adjacent low-reflectivity layer. The slope content layers in the vicinity of the active layer has an Al content x3 wherein $0 < x3 \leq 0.3$ and $0.55 \leq x3 < 1$ and an impurity concentration of $3 \times 10^{17}$ cm$^{-3}$ or above.

6 Claims, 9 Drawing Sheets

COMPARATIVE EXAMPLE

FIRST SAMPLE

VERTICAL CAVITY SURFACE EMITTING SEMICONDUCTOR LASER DEVICE

BACKGROUND OF THE INVENTION (a) Field of the Invention

The present invention relates to a vertical cavity surface emitting semiconductor laser device (VCSEL device) and, more particularly, to a VCSEL device for use as a light source in the field of optical data transmission and optical communications.

(b) Description of the Related Art

The VCSEL devices have attracted attentions in the data transmission field. The VCSEL device includes a pair of semiconductor multi-layer reflectors (referred to as DBRs hereinafter) overlying a semiconductor substrate, and a resonant cavity sandwiched between the DBRs and including an active layer for laser emission and a pair of cladding layers sandwiching therebetween the active layer. Each DBR includes a plurality of Al(Ga)As/(Al)GaAs layer pairs, and one of the DBRs passes therethrough a laser beam in the direction perpendicular to the substrate surface.

FIG. 11 shows a conventional VCSEL device, which includes an n-type GaAs (n-GaAs) substrate 111, and a layer structure formed thereon by an epitaxial growth process. The layer structure includes consecutively, as viewed from the n-GaAs substrate 111, an n-type lower DBR 112, an n-type lower cladding layer 113, an active layer or active layer structure 114, a p-type lower cladding layer 115, a current confinement layer 116, a p-type upper DBR 117, and a p-type GaAs cap layer 118. The VCSEL device further includes a p-side electrode 119 formed on the layer structure and an n-side electrode 120 formed on the bottom surface of the n-GaAs substrate 111. The active layer (or active layer structure) 114 emits light by recombination of positive holes and electrons injected from the p-side electrode 19 and the n-side electrode 20, respectively.

FIG. 12 shows the structure of the n-type DBR 112 as well as the p-type DBR 117. Each of the lower and upper DBRs 112 and 117 includes a plurality of layer pairs each including an $Al_{x11}Ga_{1-x11}As$ high-reflectivity layer 112A and an $Al_{x12}Ga_{1-x12}As$ low-reflectivity layer 112B, and an $Al_{x13}Ga_{1-x13}As$ slope content layer 112C sandwiched between each of the high-reflectivity layer 112A and each adjacent low-reflectivity layer 112B, wherein $0 \leq x11 < 1$, $0 < x12 \leq 1$, $x11 < x12$, $x11 < x13 < x12$. One of the $Al_{x13}Ga_{1-x13}As$ slope content layers 112C has a stepwise increasing Al content x13 between x11 and x12 as viewed from the high-reflectivity layer 112A toward the low-reflectivity layer 112B, and another of $Al_{x13}Ga_{1-x13}As$ slope content layers 112C has a stepwise decreasing Al content x13 between x12 and x11 as viewed from the low-reflectivity layer 112C toward the high-reflectivity layer 112A. The pair of DBRs 112 and 117 allow the laser generated in the active layer 114 to lase between the DBRs 112 and 117 and pass through the upper DBR 117 as a laser beam having a desired output power.

The current confinement layer 116 is disposed between the p-type cladding layer 115 and the upper DBR 117, has a non-oxidized area 116A as a current injection area and an oxidized-Al area 116B as a current confinement area, and implements a current injection path for injecting current into the active layer 114 from the p-side electrode 119. The current confinement layer 116 may be formed by replacing the $Al_{x12}Ga_{1-x12}As$ low-reflectivity layer 112B of the upper DBR 17 with an AlAs layer in the vicinity of the active layer 114 and selectively oxidizing the Al content in the AlAs layer.

In the conventional VCSEL device as described above, it is observed that the VCSEL device reduces its optical output power during a continuous laser emission operation thereof. The reduction of the optical output power sometimes results in halt of the laser emission itself and degrades the reliability of the optical data transmission.

SUMMARY OF THE INVENTION

In view of the above, it is an object of the present invention to provide a VCSEL device which is capable of suppressing the reduction of the output power during a continuous laser emission operation and removing the resultant halt of the laser emission.

The present inventors found that the reduction of the output power could be suppressed by optimizing the Al content and/or the dopant concentration of the slope content layers of the n-type DBR disposed in the vicinity of the active layer, i.e., disposed within a distance from the active layer which was equivalent to the effective cavity length of the laser device.

Thus, the present invention provides, in a first aspect thereof, a vertical cavity surface emitting semiconductor laser (VCSEL) device comprising a semiconductor substrate, and a layer structure formed thereon, the layer structure including an active layer, p-type and n-type cladding layers sandwiching therebetween the active layer, p-type and n-type semiconductor multilayer mirrors (DBRs) sandwiching therebetween the p-type and n-type cladding layers and the active layer, and a current confinement layer for injecting therethrough current to the active layer, each of the p-type and n-type DBRs including a plurality of layer pairs each including an $Al_{x1}Ga_{1-x1}As$ high-reflectivity layer ($0 \leq x1 < 1$) and an $Al_{x2}Ga_{1-x2}As$ low-reflectivity layer ($0 < x2 \leq 1$, and $x1 < x2$) and an $Al_{x3}Ga_{1-x3}As$ slope content layer ($x1 < x3 < x2$) interposed between each of the high-reflectivity layers and each of the low-reflectivity layers, each of the slope content layer having a slope Al-content profile for Al content x3, wherein the Al content x3 in the Al content profiles of the slope content layers of the n-type DBR disposed within a distance from the active layer which is equivalent to an effective cavity length of the VCSEL device is such that $0 < x3 \leq 0.3$ and $0.55 \leq x3 < 1$ in the slope content profile.

According to the VCSEL device of the first aspect of the present invention, the density of the point defects and dislocations which constitute crystal defects that cause the reduction of the laser output power in the VCSEL device can be reduced, thereby suppressing the reduction of the laser output power during the continuous laser emission.

The present invention also provides a vertical cavity surface emitting semiconductor laser (VCSEL) device comprising a semiconductor substrate, and a layer structure formed thereon, the layer structure including an active layer, p-type and n-type cladding layers sandwiching therebetween the active layer, p-type and n-type semiconductor multilayer mirrors (DBRs) sandwiching therebetween the p-type and n-type cladding layers and the active layer, and a current confinement layer for injecting therethrough current to the active layer, each of the p-type and n-type DBRs including a plurality of layer pairs each including an $Al_{x1}Ga_{1-x1}As$ high-reflectivity layer ($0 \leq x1 < 1$) and an $Al_{x2}Ga_{1-x2}As$ low-reflectivity layer ($0 < x2 \leq 1$, and $x1 < x2$) and an $Al_{x3}Ga_{1-x3}As$ slope content layer ($x1 < x3 < x2$) interposed between each of the high-reflectivity layers and each of the low-reflectivity layers, each of the slope content layers having a slope Al-content profile for Al content x3, wherein the slope content layers of the n-type DBR disposed within a distance from the active layer which is equivalent to an effective cavity length of the VCSEL device has an impurity concentration of $3 \times 10^{17}$ cm$^{-3}$ or above.

According to the VCSEL device of the second aspect of the present invention, the electric resistance of the VCSEL device falls within a suitable range, which suppresses the dislocations occurring during the laser emission, thereby stabilizing the laser output power during the continuous laser emission.

The above and other objects, features and advantages of the present invention will be more apparent from the following description, referring to the accompanying drawings.

PREFERRED EMBODIMENTS OF THE INVENTION

Figure 1:
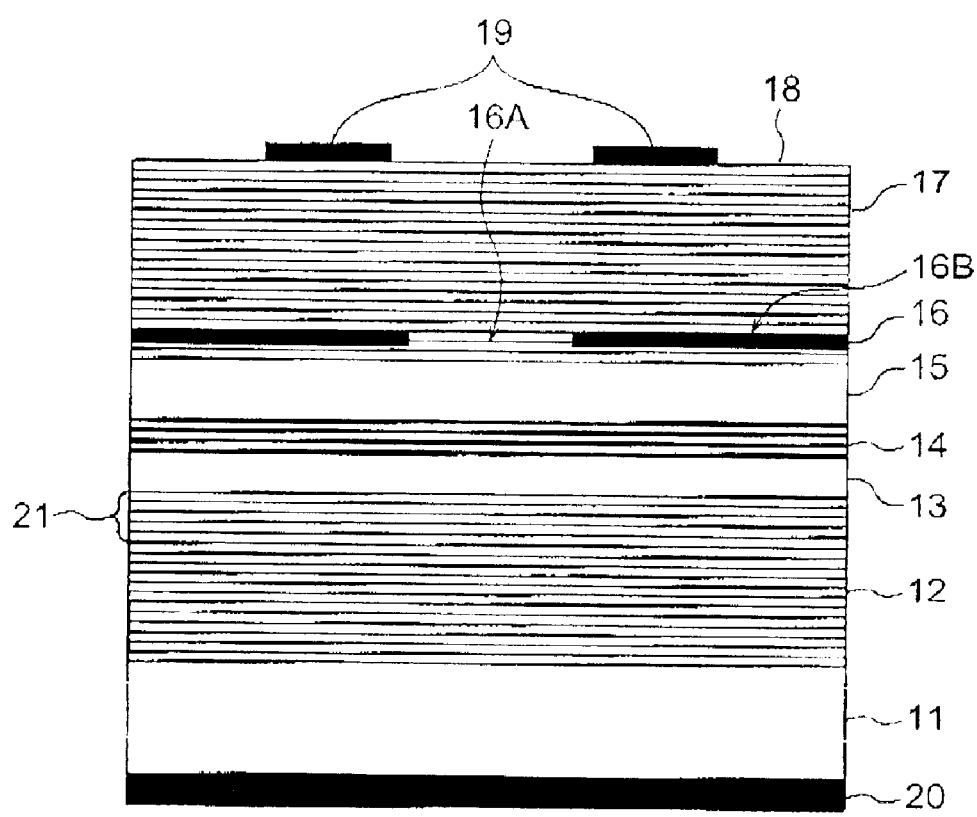
FIG. 1 is a sectional view of a VCSEL device according to an embodiment of the present invention.

Before describing preferred embodiments of the present invention, the principle of the present invention will be described for a better understanding of the present invention.

In general, degradation of a typical facet emission semiconductor laser device occurs due to the dislocation of a semiconductor layer caused by meltdown thereof at the rear facet of the laser device, which is generally called catastrophic optical damage (COD), or occurs due to the defect called dark line defect (DLD). On the other hand, since generation of a dislocation loop has been observed in the cross section of a degraded VCSEL device by using a transmission electron microscope, the degradation of the VCSEL device is considered to occur due to the point defects or combination thereof, the latter being generally called dislocation, in the crystal structure of the layer structure of the laser device.

For improved reliability of a specific type of the VCSEL having an oxidized current confinement layer, the degradation in the VCSEL device may be suppressed by using an $Al_{0.98}Ga_{0.02}As$ layer instead of the AlAs layer which is generally employed as the oxidized current confinement layer. More specifically, it is known that the AlAs layer causes after oxidation thereof a 30 to 40% reduction in the volume thereof to thereby generate a high internal stress. Thus, the use of the $Al_{0.98}Ga_{0.02}As$ layer instead of the AlAs layer may be expected to reduce the dislocations due to a lower internal stress. However, the use of the $Al_{0.98}Ga_{0.02}As$ layer itself cannot in fact reduce the density of the point defects or the dislocations, although it significantly reduces the rate of such degradation.

Thus, the present inventors attempted to experimentally find the layer structure which inherently reduced the density of the point defects and the dislocations. The principle of the present invention which allows reduction of the point defects and the dislocations by employing the configurations as recited above is such that the specific slope content layer having the specific slope Al content has a considerably reduced density of the crystal defects which cause the point defects or the dislocations, and such that the specific dopant concentration of the specific slope content layer reduces the device resistance and allows the laser device to lase at a higher output power.

The present invention achieve remarkable advantages in a specific VCSEL device having a longer emission wavelength range such has 1000 nm or longer. This is because the VCSEL device having a longer emission wavelength has a higher absorption loss due to free electrons, and has a larger thickness in each layer of the DBRs corresponding to the longer emission wavelength. In general, for a VCSEL device having a longer emission wavelength, an optimum GaAs layer can be used for each high-reflectivity layer of the DBRs in the VCSEL device, and it is desired that the optimum GaAs high-reflectivity layer and the adjacent low-reflectivity layer be coupled via a slope content layer disposed therebetween to achieve a continuous Al content profile, for the purpose of obtaining a smooth reflectivity profile between the GaAs high-reflectivity layer and the low-reflectivity layer.

To the contrary, however, based on the above findings, the present invention uses the specific slope content layer having a specific slope content profile for the Al content x3 which resides other than the range between 0.3 and 0.55, as will be detailed below.

Now, the present invention is more specifically described with reference to accompanying drawings, wherein similar constituent elements are designated by similar or related reference numerals.

Referring to FIG. 1, a VCSEL device according to a first embodiment of the present invention is similar to the conventional VCSEL device described with reference to FIGS. 11 and 12 except that the n-type DBR in the present embodiment includes slope content layers having a specific Al-content profile and a specific impurity concentration, and that a heavily doped p-GaAs layer 18 is provided as the topmost layer of the upper DBR 17 in the present embodiment in stead of the p-GaAs cap layer 118 in FIG. 11.

More specifically, the VCSEL device of the present embodiment includes an n-type GaAs (n-GaAs) substrate 11, and a layer structure formed thereon by an epitaxial growth process. The layer structure includes consecutively, as viewed from the n-type GaAs substrate 11, an n-type lower DBR 12, an n-type lower cladding layer 13, an active layer 14, a p-type lower cladding layer 15, a current confinement layer 16 including a non-oxidized area 16A and an oxidized-Al area 16B, a p-type upper DBR 17, and the heavily doped GaAs layer 18. The VCSEL device further includes a p-side electrode 19 formed on the layer structure and an n-side electrode 20 formed on the bottom surface of the n-GaAs substrate 11.

The active layer 14 and the n-type and p-type cladding layers 13 and 15 constitute a resonant cavity, the length of which as measured in the thickness direction is called a cavity length.

Figure 2:
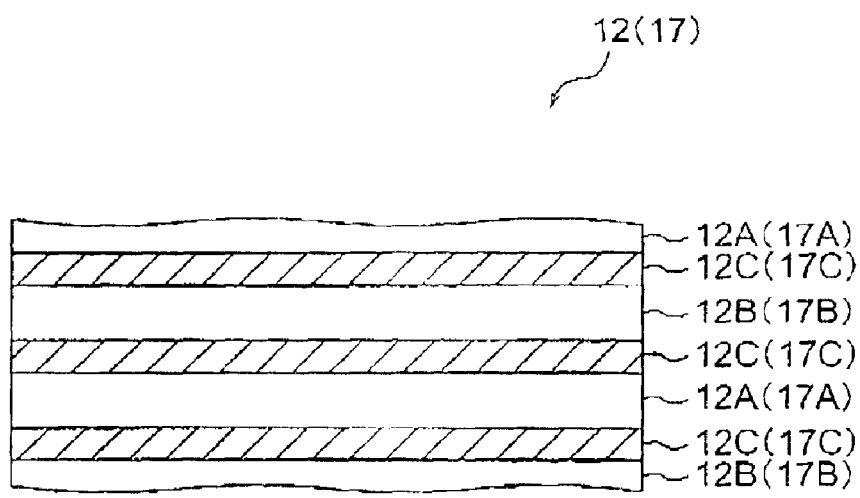
FIG. 2 is an enlarged partial sectional view of the upper and lower DBRs shown in FIG. 1.

Referring to FIG. 2, each of the lower and upper DBRs 12 and 17 includes a plurality of layer pairs each including an $Al_{x1}Ga_{1-x1}As$ high-reflectivity layer 12A and an $Al_{x2}Ga_{1-x2}As$ low-reflectivity layer 112B, and an $Al_{x3}Ga_{1-x3}As$ slope content layer 112C sandwiched between each of the high-reflectivity layers 12A and each of the low-reflectivity layers 112B adjacent to the each of the high-reflectivity layer 112A.

Each of the $Al_{x3}Ga_{1-x3}As$ slope content layers of the n-type DBR 17 disposed in the vicinity of the active layer, i.e., within a distance from the active layer roughly equal to the effective cavity length of the laser device, has an Al content x3, wherein $0<x3 \leq 0.3$ or $0.55 \leq x3 <1$. In addition, the each of the $Al_{x3}Ga_{1-x3}As$ slope content layers disposed in the vicinity of the active layer has an impurity concentration of $3 \times 10^{17}$ cm$^{-3}$ or above.

The VCSEL device of the present embodiment is fabricated by the process as described below. The process begins with the n-GaAs substrate 11 on which 35.5 pairs of n-type semiconductor layers constituting the n-type DBR 12, nGaAs lower cladding layer 13, GaInNAs/Ga(N)As MOW active layer structure 14 including three GaInNAs(Sb) QW layers each having a thickness of 7 nm, and p-GaAs upper cladding layer 15 are consecutively grown using a metal-organic chemical vapor deposition (MOCVD) technique. On top of the p-GaAs upper cladding layer 15, 26 pairs of p-type semiconductor layers constituting the p-type DBR 17 are grown, wherein a heavily-doped p-GaAs layer 18 is formed as the topmost GaAs layer of the p-type DBR 17. In addition, one of the low-reflectivity layer of the p-type DBR 17 in the vicinity of the active layer 14 is replaced by an AlAs layer, the Al content of which is to be selectively oxidized to form a current confinement layer 16. The current confinement layer 16 has a peripheral oxidized-Al area 16B and a central non-oxidized area 16A, which acts as a current injection area.

In the specific example of the process, the n-type (or p-type) DBR 12 (17) includes a plurality of GaAs high-reflectivity layer 12A (17A), a plurality of $Al_{0.9}Ga_{0.1}As$ low-reflectivity layer 12B, and a plurality of $Al_{x3}Ga_{1-x3}As$ slope content layers each sandwiched between a corresponding GaAs high-reflectivity layer 12A and a corresponding low-reflectivity layer 12B.

Figure 3A:
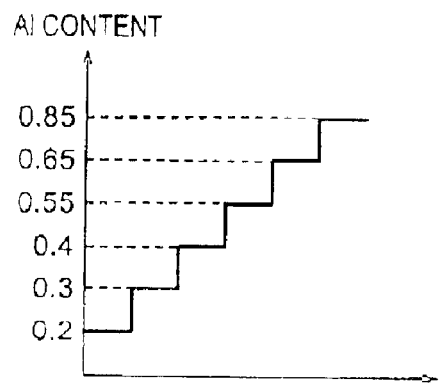
FIGS. 3A and 3B are Al content profiles in slope content layers disposed far from the active layer.
Figure 3B:
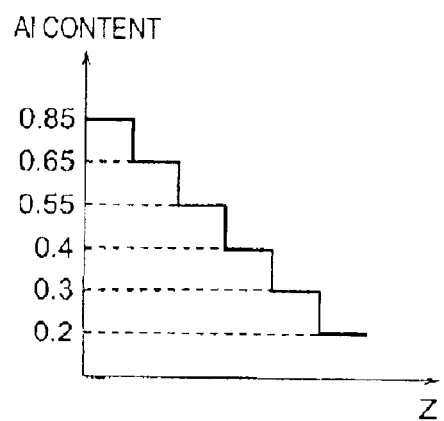

Referring to FIGS. 3A and 3B, there are shown Al content profiles for x3 of the $Al_{x3}Ga_{1-x3}As$ slope content layers corresponding to 30.5 layer pairs of the n-type DBR 12, which are disposed far from the active layer 14. All the $Al_{x3}Ga_{1-x3}As$ slope content layers of the p-type DBR 17 have similar Al content profiles shown in FIGS. 3A and 3B, which are similar to those in the conventional VCSEL device. One of the thirty $Al_{x3}Ga_{1-x3}As$ slope content layers 12C overlying the adjacent GaAs high-reflectivity layer 12A and underlying the adjacent $Al_{0.9}Ga_{0.1}As$ low-reflectivity layer 12B has a stepwise increasing Al content profile from 0.2 to 0.85 as viewed from the bottom toward the top of the $Al_{x3}Ga_{1-x3}As$ slope content layer 12C, as shown in FIG. 3A. The stepwise increase profile includes 0.4 for x3, which falls between 0.3 and 0.55.

One of the thirty $Al_{x3}Ga_{1-x3}As$ slope content layers 12C overlying the adjacent $Al_{0.9}Ga_{0.1}As$ low-reflectivity layer 12B and underlying the adjacent GaAs high-reflectivity layer 12A has a stepwise decreasing Al content profile from 0.85 to 0.2 as viewed from the bottom toward the top of the $Al_{x3}G_{1-x3}As$ slope content layer 12C, as shown in FIG. 3B. The stepwise decrease profile includes 0.4 for x3, which falls between 0.3 and 0.55.

Figure 3C:
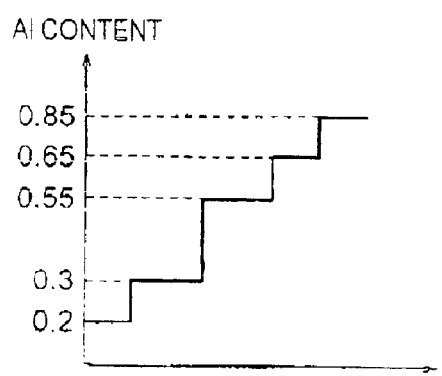
FIGS. 3C and 3D are Al content profiles in the slope content layers disposed in the vicinity of the active layer.
Figure 3D:
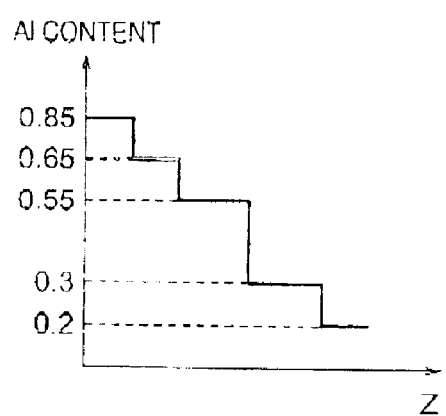

Referring to FIGS. 3C and 3D, there are shown Al content profiles for x3 of the remaining $Al_{x3}Ga_{1-x3}As$ slope content layers of the n-type DBR 12 disposed in the vicinity of the active layer 14. One of the five $Al_{x3}Ga1_{-x3}As$ slope content layers 12C overlying the adjacent GaAs high-reflectivity layer 12A and underlying the adjacent $Al_{0.9}Ga_{0.1}As$ low-reflectivity layer has a stepwise increasing Al content profile from 0.2 to 0.85 as viewed from the bottom toward the top of the $Al_{x3}Ga_{1-x}As$ slope content layer, as shown in FIG. 3C. The stepwise increase profile does not include a value, which falls between 0.3 and 0.55. One of the five $Al_{x3}Ga_{1-x3}As$ slope content layers 12C overlying the adjacent $Al_{0.9}Ga_{0.1}As$ low-reflectivity layer 12B and underlying the adjacent GaAs high-reflectivity layer 12A has a stepwise decreasing Al content profile from 0.85 to 0.2 as viewed from the bottom toward the top of the $Al_{x3}Ga_{1-x3}As$ slope content layer. The stepwise decrease profile does not include a value, which falls between 0.3 and 0.55, as shown in FIG. 3D.

In the step for fabrication of the n-type DBR 12, thirty pairs of slope content layers 12C are formed similarly to those in the conventional VCSEL device, and each of the remaining five pairs of slope content layers 12C is formed to have the slope content profile shown in FIG. 3C or 3D, which does not include a value falling between 0.3 and 0.55 for the Al content x3.

Figure 4:
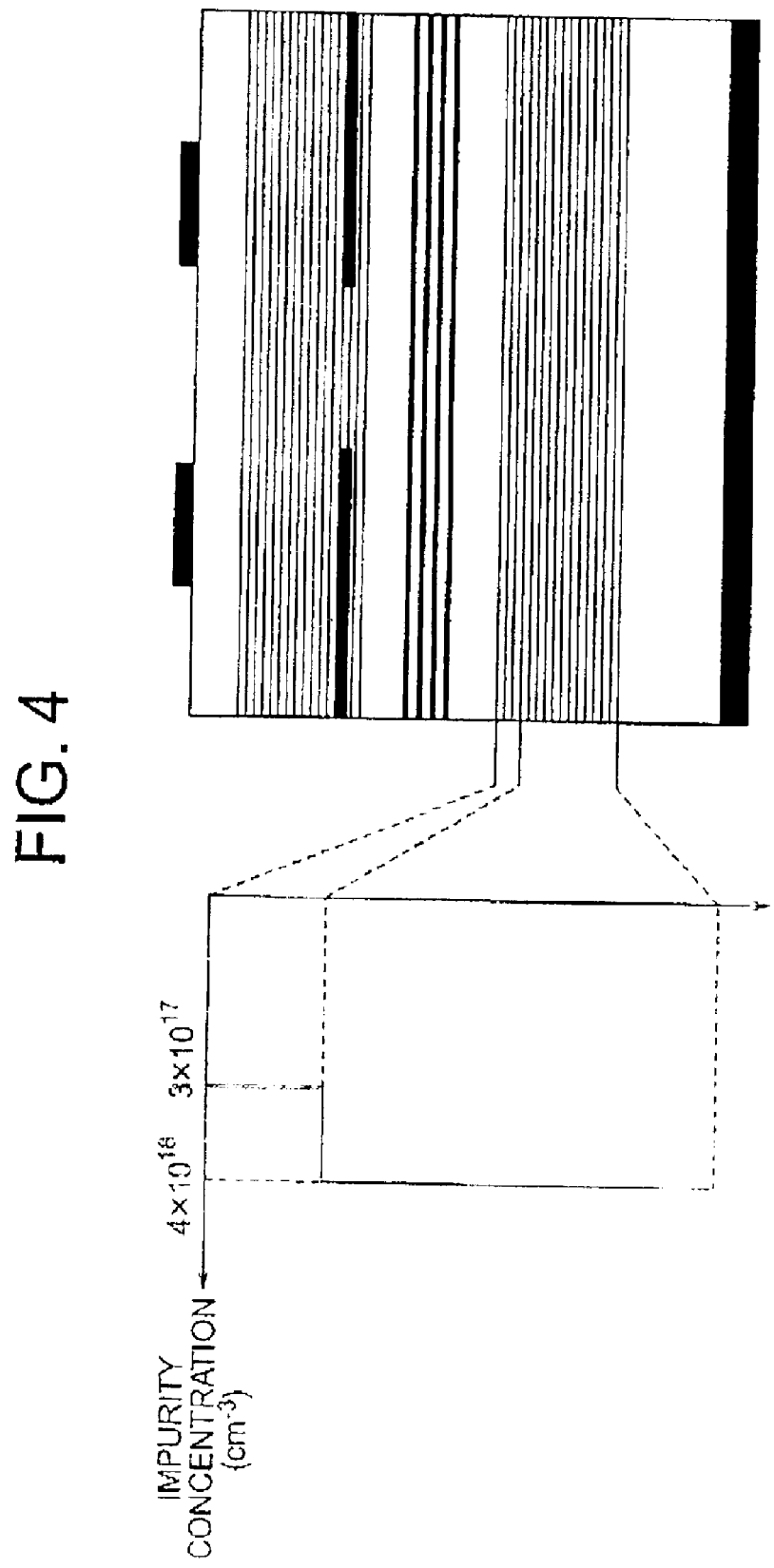
FIG. 4 is an impurity concentration profile of the slope content layers in the n-type DBR of the VCSEL device of the embodiment.

In addition, the n-type DBR 12 has an impurity concentration profile shown in FIG. 4. The layers including 30.5 high-reflectivity/low-reflectivity layer pairs disposed far from the active layer 14 and corresponding slope content layers 12C have an impurity concentration of $4 \times 10^{18}$ cm$^{-3}$, whereas the layers including 5 high-reflectivity/low-reflectivity layer pairs disposed in the vicinity of the active layer and corresponding slope content layers 12C have an impurity concentration of $3 \times 10^{17}$ cm$^{-3}$. The term "vicinity of the active layer" as used herein means that these layers reside within a distance from the active layer 14 which corresponds to the effective cavity length of the VCSEL device.

After depositing the layer structure including the upper and lower DBRs 12 and 17 and the top p-GaAs cap layer 18, a SiNx film is deposited on the layer structure, followed by forming thereon a photoresist film. The photoresist film is subsequently patterned by an ordinary photolithographic technique to have a circular opening having a diameter of 45 μm. While using the circular pattern of the photoresist film as an etching mask, the SiNx film is patterned by a reactive ion etching (RIE) technique using a $CF_4$ gas to form a circular SiNx mask. While using the photoresist pattern and the SiNx mask as an etching mask, the layer structure is subjected to RIE until the lower DBR 12 is etched, to thereby form a columnar mesa post.

The entire wafer is subjected to a thermal treatment in a steam ambient at a temperature of 400 degrees C. for twenty minutes, thereby selectively oxidizing the AlAs layer on the upper DBR 17 to form a current confinement layer 16 including an annular oxidized-Al area 16B and a central non-oxidized area 16A. In the thermal treatment, the inner diameter of the annular oxidized-Al area 16B is controlled for adjusting the threshold current and the temperature characteristic of the VCSEL device.

Subsequently, the photoresist pattern and the SiNx mask are removed, followed by depositing another SiNx film over the entire area by using a plasma-enhanced CVD technique and patterning thereof, to form an annular opening. The annular opening has an inner diameter equivalent to the diameter of the non-oxidized area or current injection area 16A, and an outer diameter equal to this inner diameter plus several micrometers. A AuZn p-side electrode 19 is then formed in the annular opening of the SiNx film, whereas an n-side electrode 20 having a AuGeNi/Au layer structure is formed on the bottom surface of the n-GaAs substrate 11. Finally, a pair of Ti/Pt/Au pads for mounting thereon bonding wires are formed in contact with both the p-side and n-side electrodes 19 and 20, thereby obtaining the VCSEL device of the present embodiment.

Figure 11:
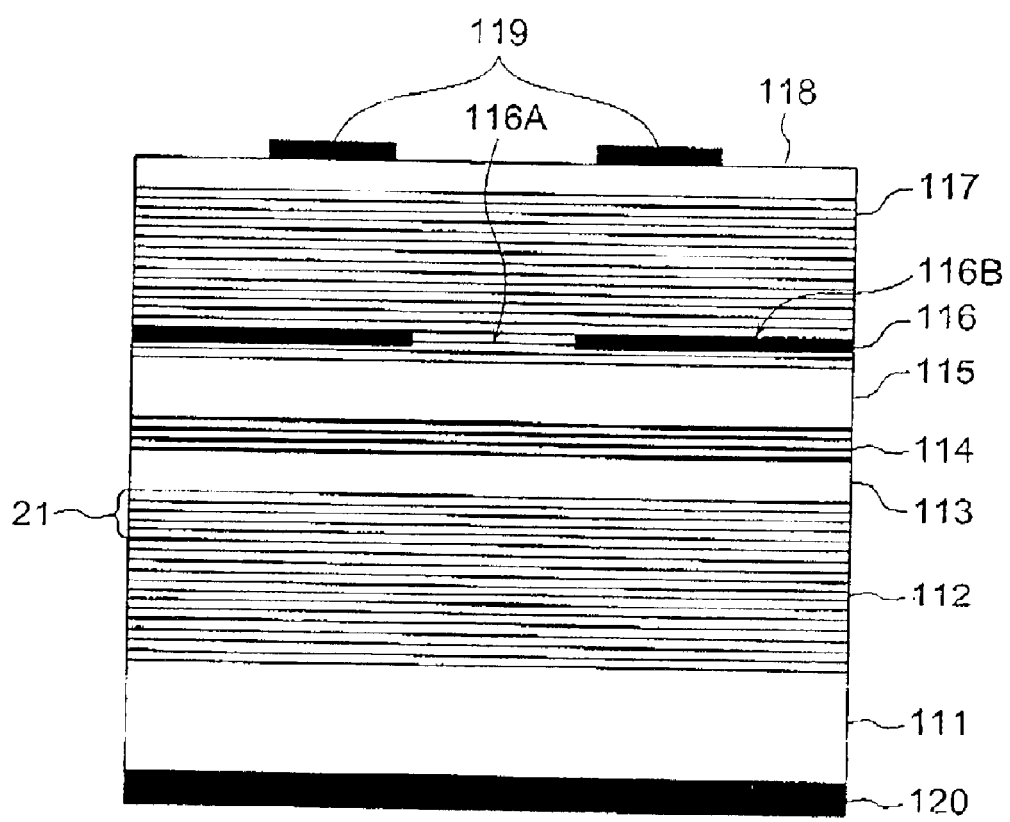
FIG. 11 is a sectional view of a conventional VCSEL.
Figure 12:
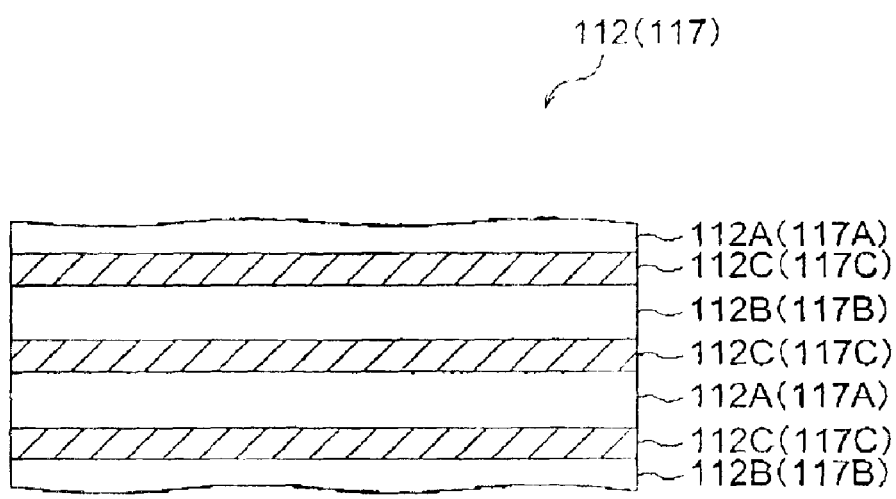
FIG. 12 is an enlarged partial sectional view of the upper and lower DBRs shown in FIG. 11.

For assuring the advantages of the structure in the VCSEL device of the present invention, sample VCSEL devices of the above embodiment and a comparative example of the conventional VCSEL device of FIG. 11 were manufactured and subjected to characteristic tests. Each sample was similar to the comparative example except for the slope content profile and/or the impurity concentration of the slope content layers.

The samples included a first sample wherein the Al content x3 in the five pairs of $Al_{x3}Ga_{1-x3}As$ slope content layer falls outside the range between 0.3 and 0.55, a second sample wherein the impurity concentration of the five pairs of $Al_{x3}Ga_{1-x3}As$ slope content layer 12C is $3 \times 10^{17}$ cm$^{-3}$ with the impurity concentration of the other 30.5 pairs of the $Al_{x3}Ga_{1-x3}As$ slope content layers 12C being $4 \times 10^{18}$ cm$^{-3}$, and a third sample wherein the Al content in the five pairs of $Al_{x3}Ga_{1-x3}As$ slope content layer falls outside the range between 0.3 and 0.55, and the impurity concentration of the five pairs of $Al_{x3}Ga_{1-x3}As$ slope content layer is $3 \times 10^{17}$ cm$^{-1}$, with the impurity concentration of the other 30.5 pairs of the $Al_{x3}Ga_{1-x3}As$ slope content layers being $4 \times 10^{18}$ cm$^{-3}$.

Figure 5:
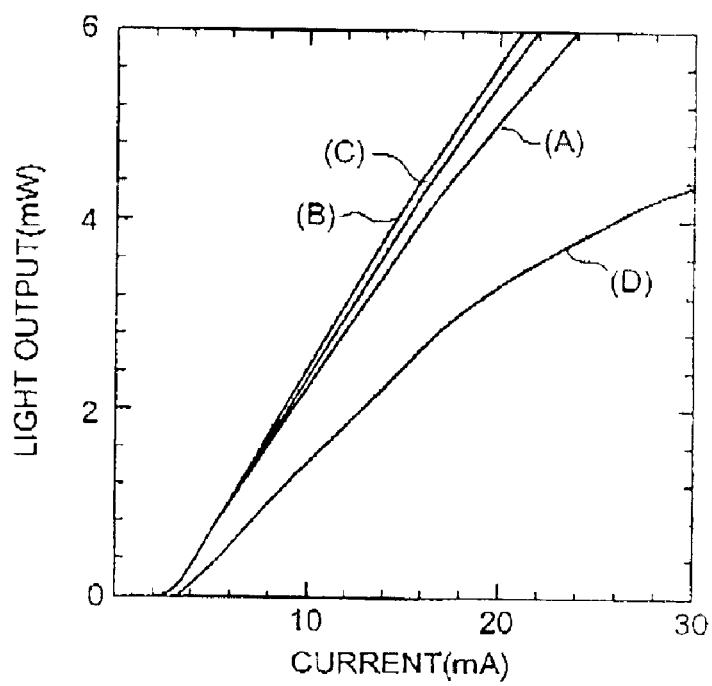
FIG. 5 is a graph showing optical output-injection current characteristics for the sample VCSEL devices of the embodiment and the conventional VCSEL.

The results of the optical output-injection current characteristic tests are shown in FIG. 5, wherein the results of the first through third samples correspond to curves (A), (B) and (C), respectively, and the result of the comparative example corresponds to curve (D). As understood from FIG. 5, the samples of the present embodiment achieved higher output powers compared to the comparative example.

Figure 6:
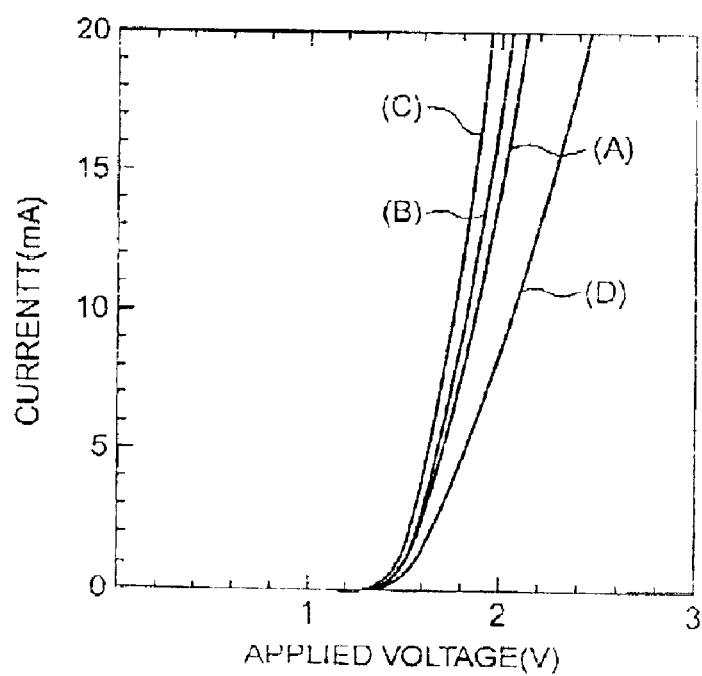
FIG. 6 is a graph showing injection current-applied voltage characteristics for the sample VCSEL devices of the embodiment and the conventional VCSEL.
Figure 7:
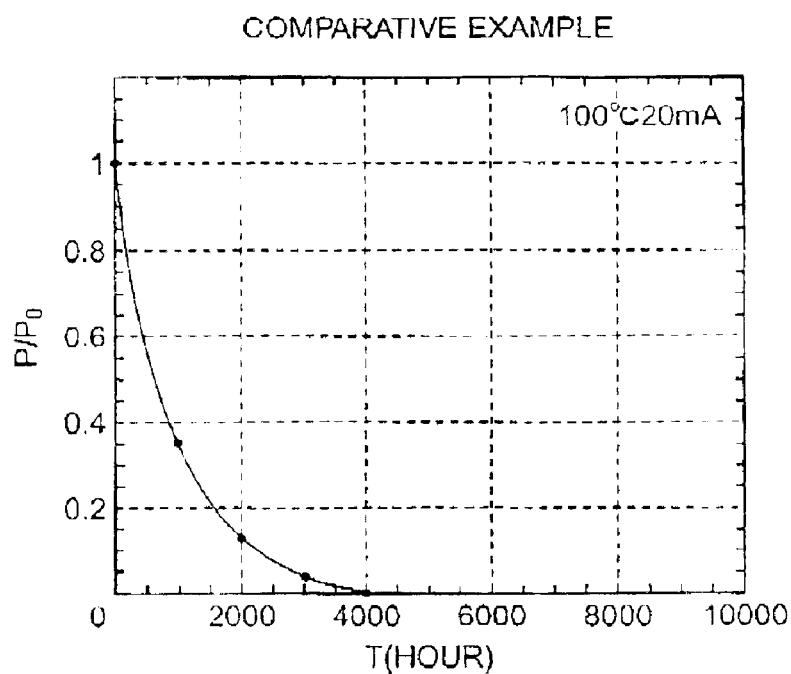
FIG. 7 is a graph showing an optical output power characteristic of the conventional VCSEL with respect to the operating time.
Figure 8:
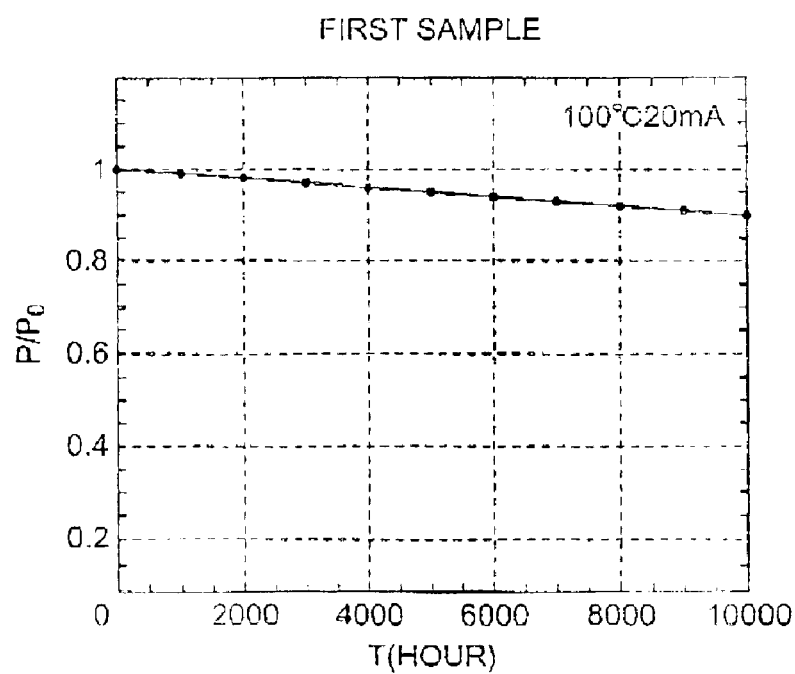
FIG. 8 is a graph showing an optical output power characteristic of the first sample VCSEL of the embodiment with respect to the operating time.
Figure 9:
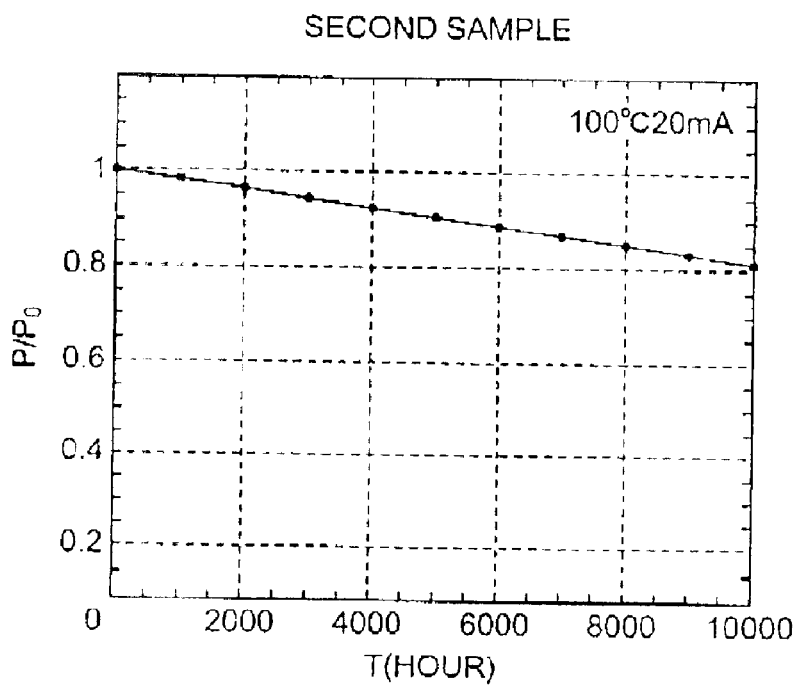
FIG. 9 is a graph showing an optical output power characteristic of the second sample VCSEL of the embodiment with respect to the operating time.
Figure 10:
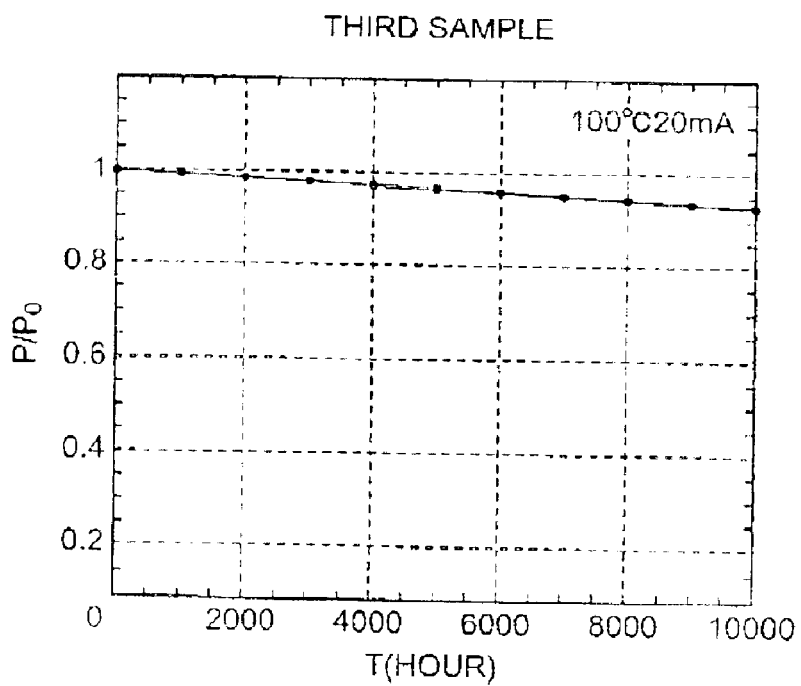
FIG. 10 is a graph showing an optical output power characteristic of the third sample VCSEL of the embodiment with respect to the operating time.

The results of the injection current-applied voltage characteristic tests are shown in FIG. 6, wherein designations similar to the designations in FIG. 5 are used. As understood from FIG. 6, the sample VCSEL devices of the present embodiment operated at lower voltages compared to the comparative example.

FIGS. 7 to 10 show output power characteristics of the comparative sample and the first through third samples, respectively, each illustrating the output power of the VCSEL device during a continuous operation thereof with the initial output power being set at unit. The tests were conducted at a temperature of 100 degrees C. and at an injection current of 20 mA. As understood from these drawings, the samples of the present embodiment were superior to the comparative example with respect to the output power characteristic, and the third sample was superior to the first sample, which was superior to the second sample. The third sample was capable of operating for 100,000 straight hours or longer at the room temperature.

A second embodiment of the present invention is such that the present invention is applied to a VCSEL device having a relatively shorter wavelength. The VCSEL device of the second embodiment has three 7-nm-thick GaAs QW layers in the $GaAs/Al_{0.2}Ga_{0.8}As$ QW structure 14 instead of the GaInNAs(Sb) QW layers in the GaInNAs(Sb)/Ga(N)As QW structure in the first embodiment, an n-$Al_{0.3}Ga_{0.7}As$ lower cladding layer 13 and a p-$Al_{0.3}Ga_{0.7}As$ upper cladding layer 15 instead of the n-GaAs lower cladding layer and the p-GaAs upper cladding layer, respectively, in the first embodiment.

The VCSEL device of the second embodiment also has $Al_{0.2}Ga_{0.8}As$ high-reflectivity layers in each of the n-type and p-type DBRs 12 and 17 instead of the GaAs high-reflectivity layers in the first embodiment, a 200-nm-thick p-GaAs cap layer 18 instead of the heavily-doped p-GaAs layer 18 in the first embodiment. In this configuration, the VCSEL device of the second embodiment has 25 layer pairs in the p-type DBR 17 which is one pair smaller compared to the first embodiment. The other configurations are similar to those in the first embodiment.

The VCSEL device of the second embodiment having a relatively shorter wavelength also achieves advantages similar to those in the first embodiment due to the above configurations. The samples of the second embodiment were manufactured, and subjected to characteristic tests, exhibiting similar excellent characteristics.

In the above embodiments, the n-type DBR is formed as the lower DBR 12; however, the p-type DBR may be formed as the lower DBR 12 so long as a p-type substrate is used. In either case, the laser beam is extracted through one of the DBRs 12 and 17. The slope content layers of the n-type DBR far from the active layer 14 in the present invention may have a slope content profile similar to that of the slope content layer in the vicinity of the active layer.

Since the above embodiments are described only for examples, the present invention is not limited to the above embodiments and various modifications or alterations can be easily made therefrom by those skilled in the art without departing from the scope of the present invention.

What is claimed is:

1. A vertical cavity surface emitting semiconductor laser (VCSEL) device comprising a semiconductor substrate, and a layer structure formed thereon, said layer structure including an active layer, p-type and n-type cladding layers sandwiching therebetween said active layer, p-type and n-type semiconductor multilayer mirrors (DBRs) sandwiching therebetween said p-type and n-type cladding layers and said active layer, and a current confinement layer for injecting therethrough current to said active layer, each of said p-type and n-type DBRs including a plurality of layer pairs each including an $Al_{x1}Ga_{1-x1}As$ high-reflectivity layer (0.1≦x<1) and an $Al_{x2}Ga_{1-x2}As$ low-reflectivity layer (0<x2≦.1, and x1<x2) and an $Al_{x3}Ga_{1-x3}As$ slope content layer (x1<x3<x2) interposed between each of said high-reflectivity layers and each of said low-reflectivity layers adjacent to said each of said high-reflectivity layers, each of said slope content layers having a slope Al-content profile for Al content x3, wherein said Al content x3 of said slope content layers of said n-type DBR disposed within a distance from said active layer which is equivalent to an effective cavity length of said VCSEL device is such that 0<x3≦0.3 and 0.55≦x3<1 in said slope Al-content profile.

2. The VCSEL device of claim 1, wherein said slope content layers are doped with at least one element selected from the group consisting of Si, Se, Sn, Te and S.

3. The VCSEL device of claim 1, wherein each of said slope content layers of said n-type and p-type DBRs other than said slope content layers of said n-type DBR disposed within said distance from said active layer has an impurity concentration of $5 \times 10^{18}$ cm$^{-3}$ or below.

4. A vertical cavity surface emitting semiconductor laser (VCSEL) device comprising a semiconductor substrate, and a layer structure formed thereon, said layer structure including an active layer, p-type and n-type cladding layers sandwiching therebetween said active layer, p-type and n-type semiconductor multilayer mirrors (DBRs) sandwiching therebetween said p-type and n-type cladding layers and said active layer, and a current confinement layer for injecting therethrough current to said active layer, each of said p-type and n-type DBRs including a plurality of layer pairs each including an $Al_{x1}Ga_{1-x1}As$ high-reflectivity layer ($0.1 \leq x1 < 1$) and an $Al_{x2}Ga_{1-x2}As$ low-reflectivity layer ($0 < x2 \leq 0.1$, and $x1 < x2$) and an $Al_{x3}Ga_{1-x3}As$ slope content layer ($x1 < x3 < x2$) interposed between each of said high-reflectivity layers and each of said low-reflectivity layers adjacent to said each of said high-reflectivity layers, each of said slope content layers having a slope Al-content profile for Al content x3, wherein said slope content layers of said n-type DBR disposed within a distance from said active layer which is equivalent to an effective cavity length of said VCSEL device has an impurity concentration of $3 \times 10^{17}$ cm$^{-3}$ or above wherein said Al content x3 of said slope content layers of said n-type DBR disposed within said distance from said active layer is such that $0 < x3 \leq 0.3$ and $0.55 \leq x3 < 1$ in said slope Al-content profile.

5. The VCSEL device of claim 4, wherein said slope content layers are doped with at least one element selected from the group consisting of Si, Se, Sn, Te and S.

6. The VCSEL device of claim 1, wherein each of said slope content layers of said n-type and p-type DBRs other than said slope content layers of said n-type DBR disposed within said distance from said active layer has an impurity concentration of $5 \times 10^{18}$ cm$^{-3}$ or below.

* * * * *